(12) United States Patent
Aichi

(10) Patent No.: US 10,468,533 B2
(45) Date of Patent: Nov. 5, 2019

(54) SEMICONDUCTOR DEVICE AND METHOD FOR MANUFACTURING SAME

(71) Applicant: SHARP KABUSHIKI KAISHA, Sakai, Osaka (JP)

(72) Inventor: Hiroshi Aichi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/569,283

(22) PCT Filed: Apr. 19, 2016

(86) PCT No.: PCT/JP2016/062369
§ 371 (c)(1),
(2) Date: Oct. 25, 2017

(87) PCT Pub. No.: WO2016/175086
PCT Pub. Date: Nov. 3, 2016

(65) Prior Publication Data
US 2018/0122955 A1 May 3, 2018

(30) Foreign Application Priority Data

Apr. 28, 2015 (JP) .................................. 2015-091063

(51) Int. Cl.
*H01L 29/786* (2006.01)
*H01L 21/265* (2006.01)
(Continued)

(52) U.S. Cl.
CPC ...... *H01L 29/78627* (2013.01); *H01L 21/266* (2013.01); *H01L 21/26513* (2013.01);
(Continued)

(58) Field of Classification Search
None
See application file for complete search history.

(56) References Cited

U.S. PATENT DOCUMENTS 6,306,693 B1    10/2001  Ishiguro et al.
6,773,944 B2 *   8/2004  Okamoto ............ H01L 27/1214
                                                              438/30
(Continued)

FOREIGN PATENT DOCUMENTS

JP    H03-184372 A    8/1991
JP    H07-056189 A    3/1995
(Continued)

*Primary Examiner* — Chandra Chaudhari
(74) *Attorney, Agent, or Firm* — ScienBiziP, P.C.

(57) ABSTRACT

A semiconductor device includes at least one thin film transistor (100, 200), the at least one thin film transistor including a semiconductor layer (3A, 3B) which includes a channel region (31A, 31), a high-concentration impurity region, and a low-concentration impurity region (32A, 32B) which is located between the channel region and the high-concentration impurity region, a gate electrode (7A, 7B) provided on a gate insulating layer (5), an interlayer insulating layer (11) provided on the gate electrode, and a source electrode (8A, 8B) and a drain electrode (9A, 9B), wherein the interlayer insulating layer and the gate insulating layer have a contact hole extending to the semiconductor layer, at least one of the source electrode (8A, 8B) and the drain electrode (9A, 9B) being in contact with the high-concentration impurity region inside the contact hole, at a side wall of the contact hole, a side surface of the gate insulating layer is aligned with a side surface of the interlayer insulating layer, and at an upper surface of the semiconductor layer, an edge of the contact hole aligned with an edge of the high-concentration impurity region.

5 Claims, 10 Drawing Sheets

(51) Int. Cl.
  *H01L 21/266*    (2006.01)
  *H01L 21/324*    (2006.01)
  *H01L 27/12*     (2006.01)
  *H01L 29/66*     (2006.01)

(52) U.S. Cl.
  CPC .......... *H01L 21/324* (2013.01); *H01L 27/127* (2013.01); *H01L 27/1222* (2013.01); *H01L 27/1251* (2013.01); *H01L 27/1288* (2013.01); *H01L 29/66757* (2013.01); *H01L 29/78621* (2013.01); *H01L 29/78675* (2013.01)

(56) References Cited

U.S. PATENT DOCUMENTS

| | | | |
|---|---|---|---|
| 7,435,631 B2 * | 10/2008 | Yang | H01L 29/78621 257/E27.111 |
| 2002/0028544 A1 | 3/2002 | Fujimoto et al. | |
| 2005/0253195 A1 | 11/2005 | Toyoda et al. | |

FOREIGN PATENT DOCUMENTS

| | | |
|---|---|---|
| JP | H07-122649 A | 5/1995 |
| JP | H07-335891 A | 12/1995 |
| JP | H09-232583 A | 9/1997 |
| JP | 2001-085695 A | 3/2001 |
| JP | 2002-134756 A | 5/2002 |
| JP | 2002-175028 A | 6/2002 |
| JP | 2005-333107 A | 12/2005 |
| JP | 2007-141992 A | 6/2007 |

* cited by examiner

FIG.1
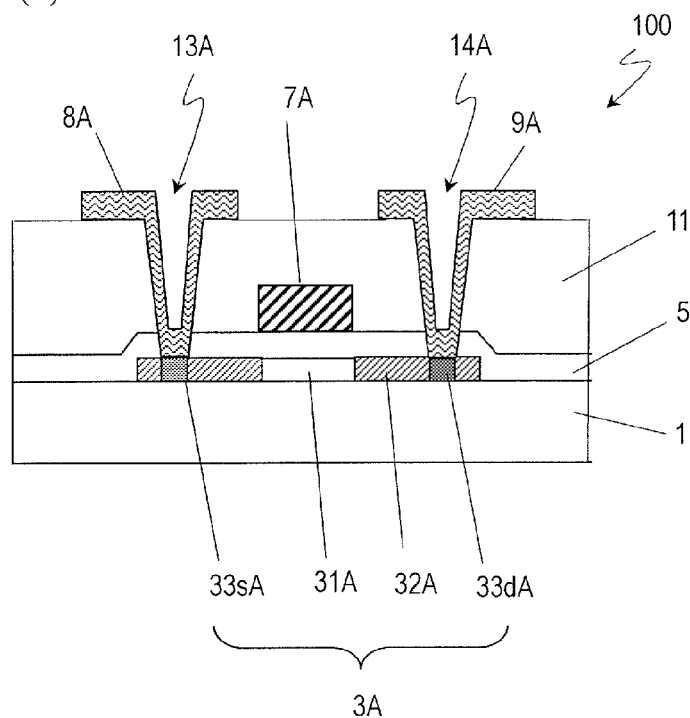
(a)
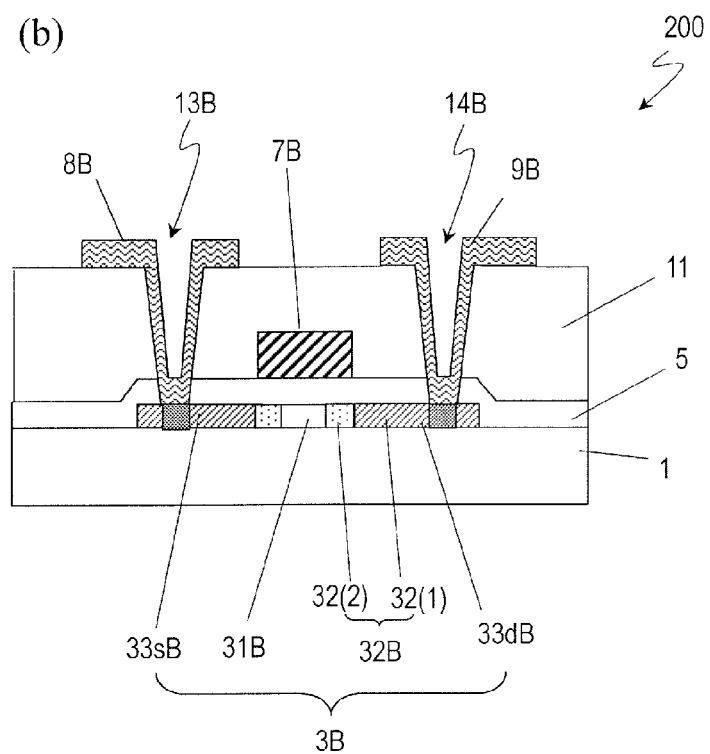
(b)

FIG.2
(a)
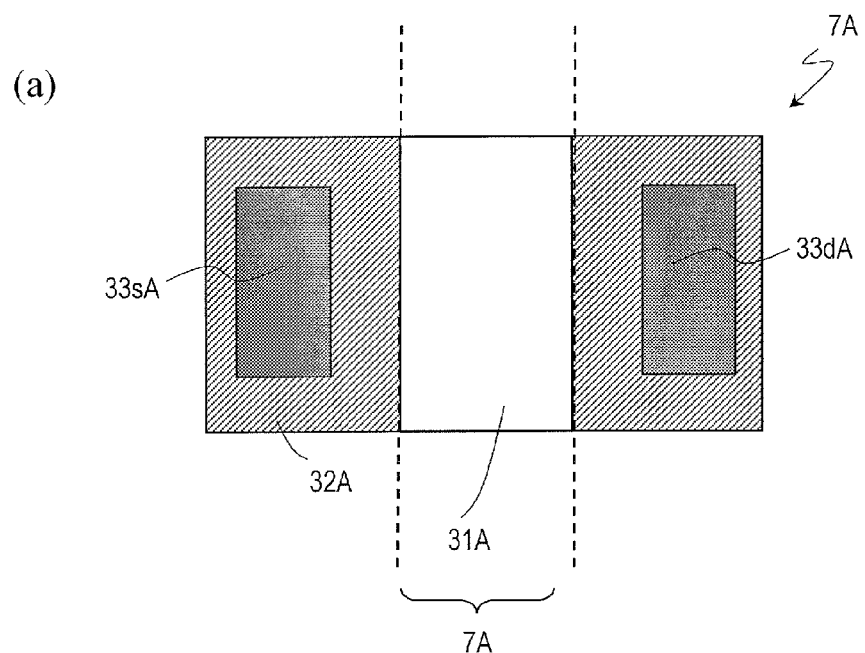
(b)
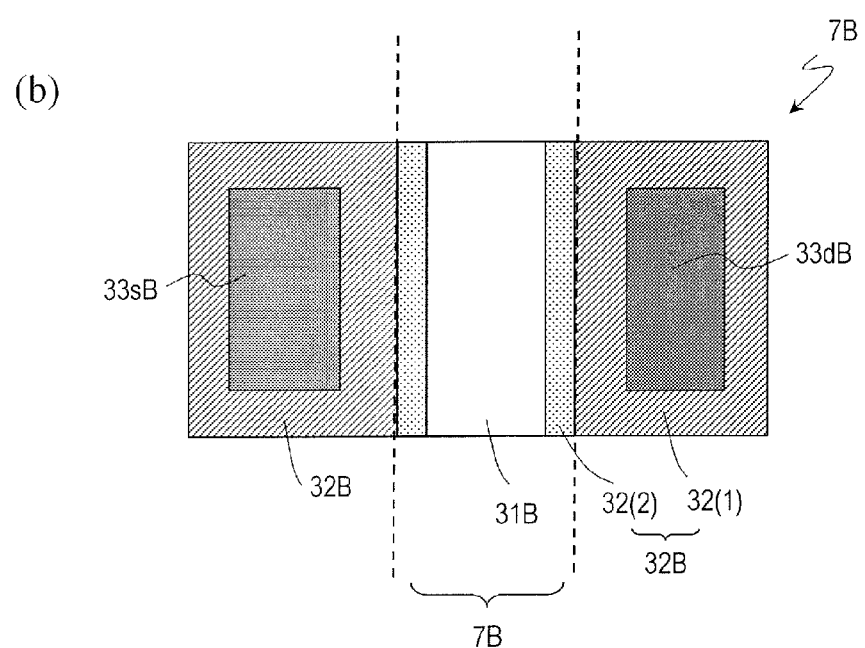

FIG.5
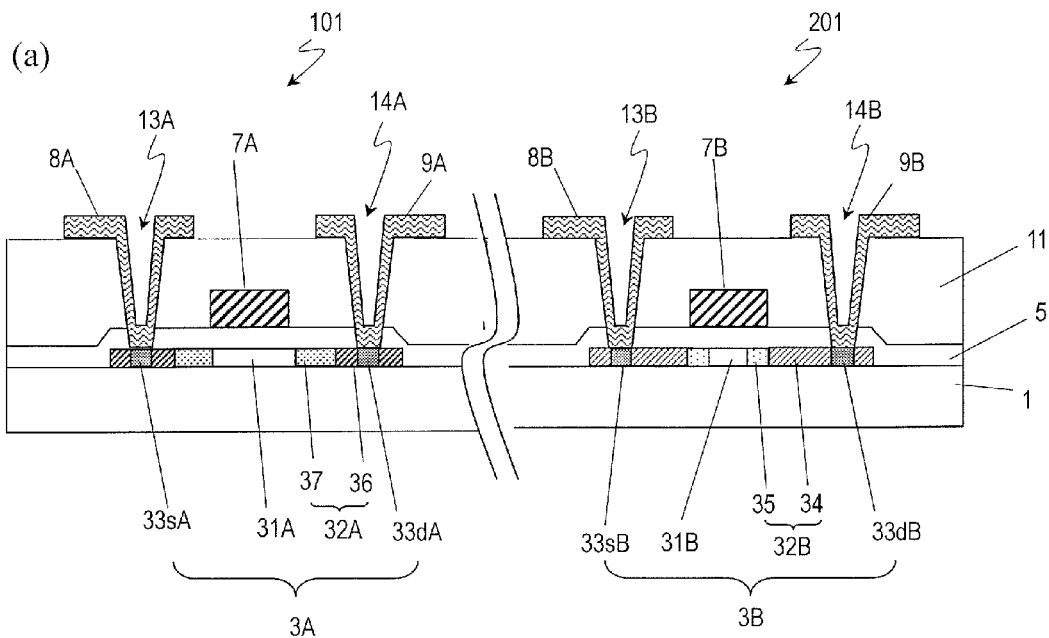
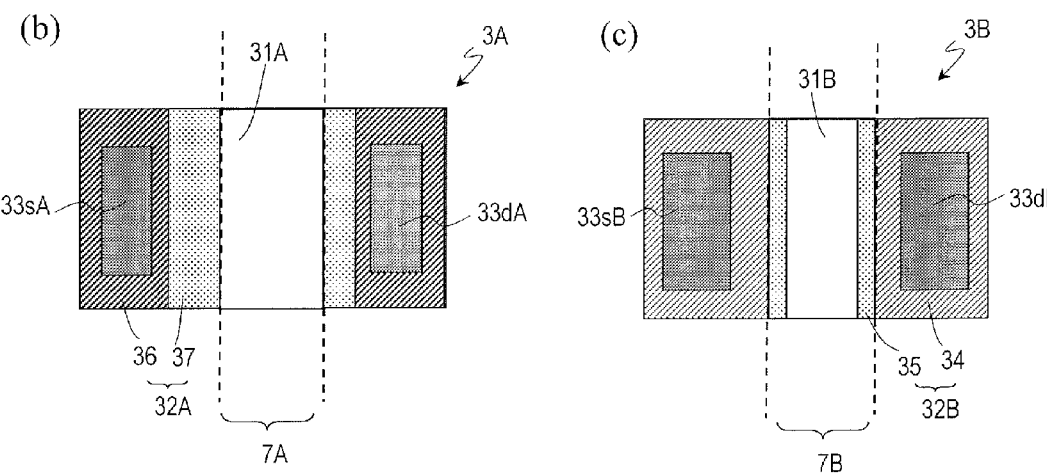

FIG.6
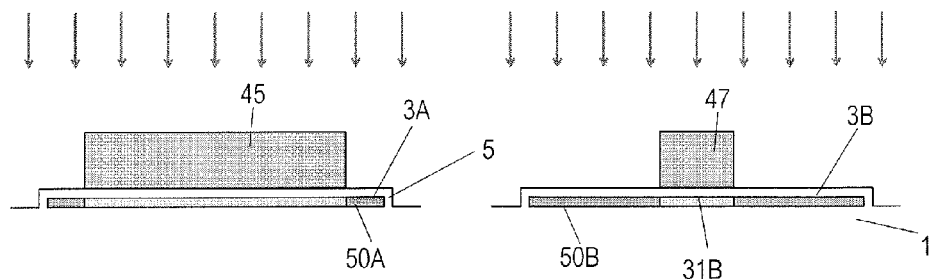
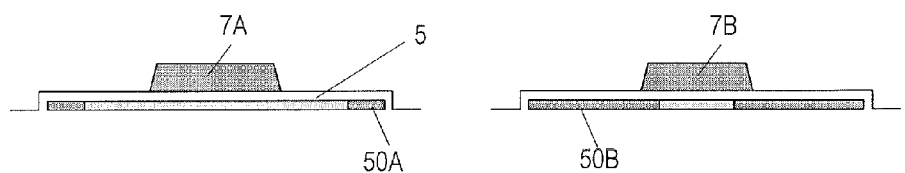
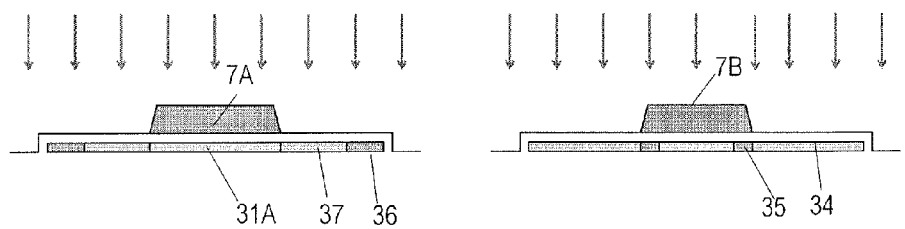
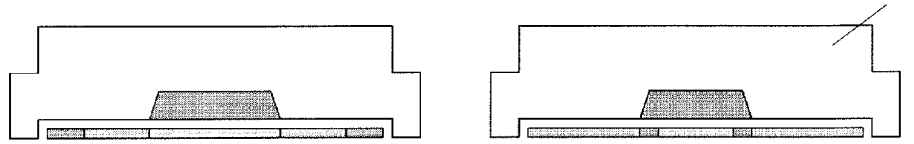
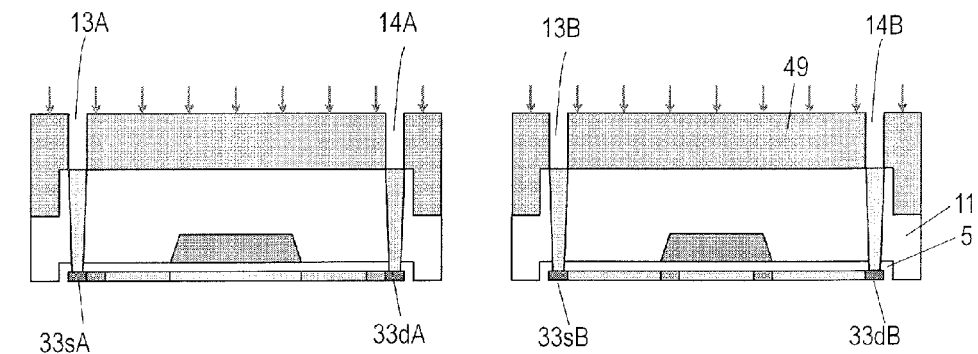

| |
|---|
| NM DOPING |
| GATE FORMATION |
| LDD DOPING |
| N+ PHOTO |
| RESIST BAKING |
| N+ DOPING |
| FULL ASHING |
| PEELING AND WASHING |
| ACTIVATION ANNEALING |
| INTERLAYER DEPOSITION |
| HYDROGENATION ANNEALING |
| CONTACT FORMATION |
| - |
| SOURCE FORMATION |

(b)

| |
|---|
| NM DOPING |
| GATE FORMATION |
| LDD DOPING |
| STEP OMITTED |
| - |
| STEP OMITTED |
| PEELING AND WASHING |
| ACTIVATION ANNEALING |
| INTERLAYER DEPOSITION |
| HYDROGENATION ANNEALING |
| CONTACT FORMATION |
| CONTACT DOPING |
| SOURCE FORMATION |
| CRYSTAL RESTORATION ANNEALING |

FIG.8
(a)
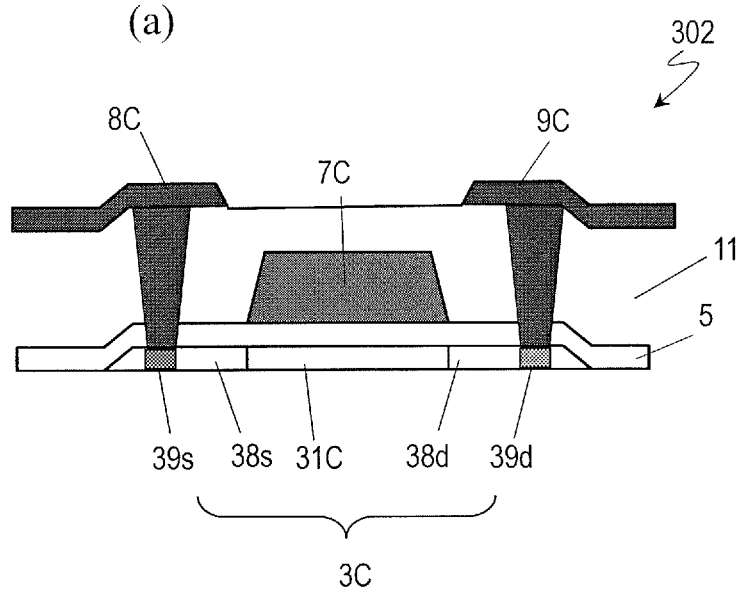
(b)
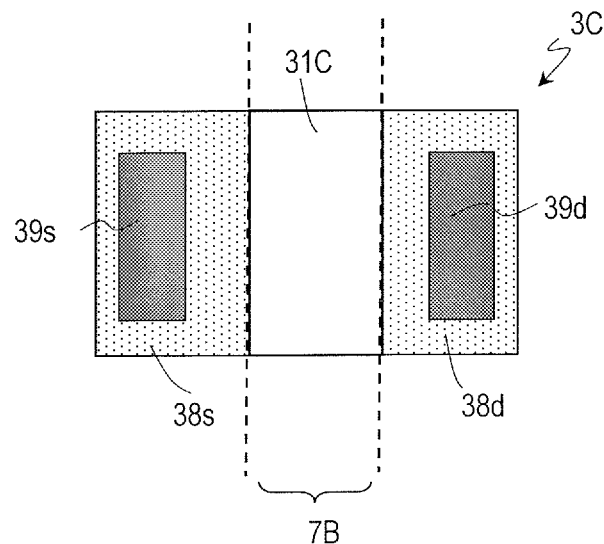

FIG.10
(a)
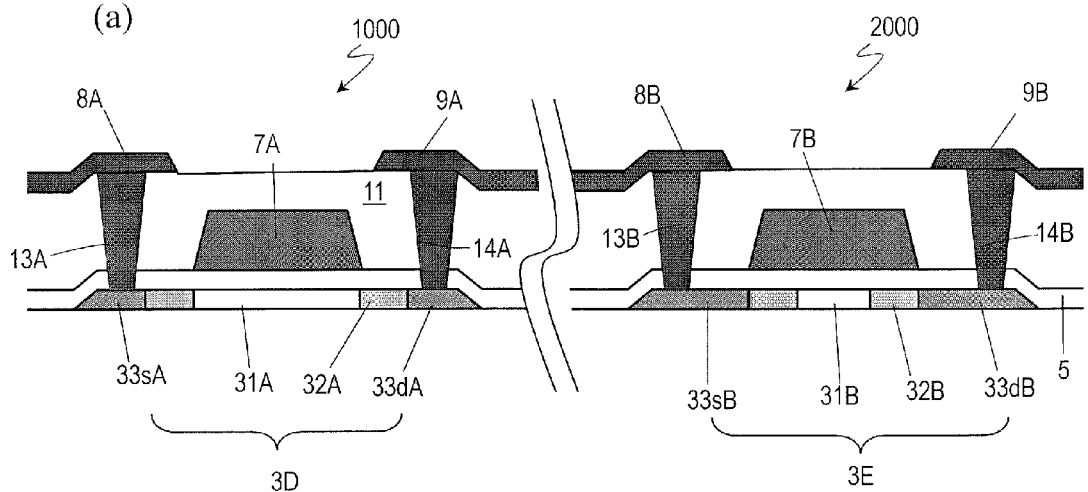
(b)
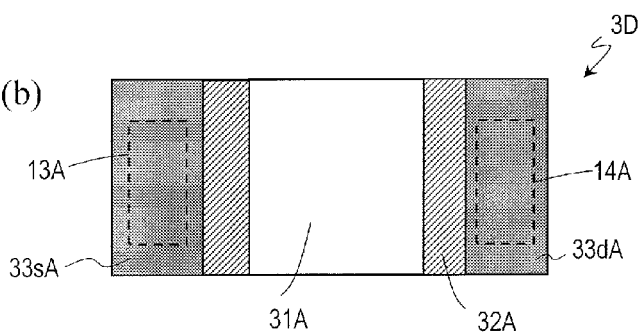
(c)
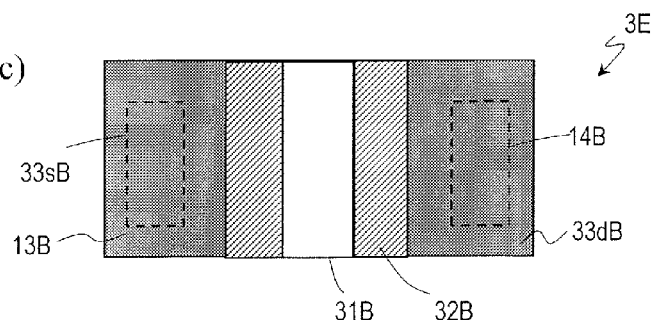

SEMICONDUCTOR DEVICE AND METHOD FOR MANUFACTURING SAME

TECHNICAL FIELD

The present invention relates to a semiconductor device and a manufacturing method thereof.

BACKGROUND ART

An active matrix substrate for use in a liquid crystal display device or the like includes a switching element, such as a thin film transistor (hereinafter, "TFT"), in each pixel. Since the field effect mobility of crystalline silicon films is usually higher than the field effect mobility of amorphous silicon films, crystalline silicon TFTs can operate at a higher speed than amorphous silicon TFTs. Therefore, when a crystalline silicon film is used, not only a TFT which is provided in each pixel as the switching element, which is referred to as "pixel TFT", but also a TFT which is a constituent of a peripheral circuit, such as a driver circuit or various functional circuits formed around the display region (in the frame region), which is referred to as "driver circuit TFT", can be formed on the same substrate.

The pixel TFT is required to allow only a very small off-current leakage. If the off-current leakage is large, flicker, crosstalk, the like, occurs, and there is a probability that it deteriorates the display quality. In view of TFT which has a LDD structure (hereinafter, abbreviated as "LDD structure TFT") is used as the pixel TFT.

The "LDD structure TFT" has a Lightly Doped Drain region (hereinafter, also abbreviated as "LDD region") in at least either one of the space between the channel region and the source region of the TFT and the space between the channel region and the drain region of the TFT. In this structure, the LDD region, which has higher resistance than the source/drain region, is located between the edge of the gate electrode and low-resistance source/drain region, and therefore, the off-current leakage can be greatly reduced as compared with a TFT which does not have a LDD region ("single drain structure").

Some active matrix substrates adopt LDD structure TFTs not only as the pixel TFTs but also as the driver circuit TFTs for the sake of simplfication of the manufacturing process. However, when LDD structure TFTs are used as the driver circuit TFTs, the following problems arise. Although the driver circuit TFTs are required to have a large current driving force, i.e., a large on-current, the LDD structure TFTs provide decreased current driving force as compared with single drain structure TFTs because the LDD region is a resistance in the LDD structure TFTs. Further, while the length of the LDD region in the channel length direction (LDD length) is optimized, there is a probability that designing the of circuits becomes complicated, or the size of the frame region increases. Further, the driver circuit TFTs, which operate at a high speed, are required to provide higher reliability.

In view of such, using TFTs in which the LDD region is overlapped by the gate electrode as the driver circuit TFTs has been proposed. Such a structure is referred to as "GOLD (Gate Overlapped LDD) structure". In a TFT which has a GOLD structure (hereinafter, abbreviated as "GOLD structure TFT"), when a voltage is applied to the gate electrode, electrons which serve as carriers are accumulated in the LDD region overlapped by the gate electrode, and therefore, the resistance of the LDD region can be reduced. Thus, decrease of the current driving force of the TFT can be suppressed. Further, by forming an electric field relaxation region under the gate, the GOLD structure TFT can secure higher reliability than the LDD structure TFT.

Note that, in this specification, a structure in which the entirety of the LDD region is not overlapped by the gate electrode is referred to as "LDD structure", and a structure in which at least part of the LDD region is overlapped by the gate electrode is referred to as "GOLD structure".

However, when GOLD structure TFTs are formed as the driver circuit. TFTs on the same substrate in addition to the LDD structure TFTs, the number of photomasks used in the manufacturing process disadvantageously increases. The photomasks are used in photolithographic ally forming resist patterns which are to serve as masks in etching steps and ion implantation steps. Therefore, increasing the number of photomasks by one means that not only the etching and ion implantation steps but also the step of photolithographically forming a resist pattern, the step of peeling off the resist pattern, and the washing and drying steps are added. Therefore, as the number of photomasks increases, the manufacturing cost increases, the lead time increases, and the productivity greatly decreases. Also, there is a probability that the production yield decreases.

In view of such a problem, various processes designed for decreasing the number of photomasks as much as possible have been proposed.

For example, Patent Document 1 discloses using a halftone mask such that a GOLD structure TFT can be formed without increasing the number of photomasks. In Patent Document 1, a resist pattern which has partially varying thicknesses is formed in a photolithography step with the use of a halftone mask, and this is used as an etching mask in etching a semiconductor film. Then, recessed portions of the resist pattern are removed, and impurity doping is performed for formation of an LDD region. Therefore, etching of the semiconductor film and formation of the LDD region can be completed through a single photolithography step, and the number of photomasks can be decreased by one.

CITATION LIST

Patent Literature

Patent Document 1: Japanese Laid-Open Patent Publication No. 2002-134756

SUMMARY OF INVENTION

Technical Problem

According to the solution disclosed in Patent Document 1, the resolution of the halftone mask is low so that it is difficult to control the line width of the resist pattern with sufficient accuracy. As such, the solution disclosed in Patent Document 1 is not applicable to some cases of manufacturing of a highly-defined TFT. Thus, according to the conventional method, it is difficult to reduce the number of photomasks while securing excellent line width controllability such that the productivity is improved.

One embodiment of the present invention was conceived in view of the above-described circumstances. One of the major objects of the present invention is to provide a semiconductor device of excellent productivity and high definition which includes TFTs that have a LDD region.

Solution to Problem

A semiconductor device of one embodiment of the present invention includes at least one thin film transistor a substrate, the at least one thin film transistor including a semiconductor layer which includes a channel region, a high-concentration impurity region containing a first conductivity type impurity, and a low-concentration impurity region which is located between the channel region and the high-concentration impurity region, the low-concentration impurity region containing the first conductivity type impurity at a concentration lower than in the high-concentration impurity region and higher than in the channel region, a gate insulating layer provided on the semiconductor layer, a gate electrode provided on the gate insulating layer and arranged so as to extend over at least the channel region, an interlayer insulating layer provided on the gate electrode and the gate insulating layer, and a source electrode and a drain electrode which are coupled with the semiconductor layer, wherein the interlayer insulating layer and the gate insulating layer have a contact hole extending to the semiconductor layer, at least one of the source electrode and the drain electrode being provided on the interlayer insulating layer and in the contact hole and being in contact with the high-concentration impurity region inside the contact hole, at a side wall of the contact hole, a side surface of the gate insulating layer is aligned with a side surface of the interlayer insulating layer, and at an upper surface of the semiconductor layer, an edge of the contact hole is aligned with an edge of the high-concentration impurity region.

In one embodiment, the high-concentration impurity region is located inside the low-concentration impurity region when viewed in a direction normal to the substrate.

In one embodiment, the at least one thin film transistor includes a first thin film transistor, and in the first thin film transistor, a part of the low-concentration impurity region is covered with the gate electrode with the gate insulating layer interposed therebetween.

In one embodiment, the at least one thin film transistor includes a second thin film transistor, and in the second thin film transistor, an edge of the low-concentration impurity region which is on the channel region side is aligned with an edge of the gate electrode.

In one embodiment, in the first thin film transistor, the low-concentration impurity region includes a first low-concentration impurity region which does not overlap the gate electrode with the gate insulating layer interposed therebetween and a second low-concentration impurity region which overlaps the gate electrode with the gate insulating layer interposed therebetween, and the first low-concentration impurity region contains the first conductivity type impurity at a concentration higher than in the second low concentration impurity region.

In one embodiment, the at least one thin film transistor further includes a second thin film transistor and, in the second thin film transistor, an edge of the low-concentration impurity region which is on the channel region side is aligned with an edge of the gate electrode, and in the second thin film transistor, the low-concentration impurity region includes a third low-concentration impurity region which is in contact with the high-concentration impurity region and a fourth low-concentration impurity region which is closer to the channel region than the third low-concentration impurity region, and the third low-concentration impurity region contains the first conductivity type impurity at a concentration higher than in the fourth low-concentration impurity region.

In one embodiment, the first low-concentration impurity region of the first thin film transistor and the third low-concentration impurity region of the second thin film transistor contain a same impurity element, and the first and third low-concentration impurity regions have substantially equal concentration profiles of the first conductivity type impurity in a thickness direction.

In one embodiment, the semiconductor device further includes another thin film transistor which has a different conductivity type from that of the at least one thin film transistor, wherein the another thin film transistor includes another semiconductor layer including a channel region, a contact region, and another high-concentration impurity region which located between the channel region and the contact region and which contains a second conductivity type impurity, the contact region containing the second conductivity type impurity at a same concentration as the another high concentration impurity and containing the first conductivity type impurity at a concentration higher than the another high concentration impurity, the gate insulating layer extending over the another semiconductor layer, another gate electrode provided on the gate insulating layer, the interlayer insulating layer extending over the another gate electrode and the gate insulating layer, and another source electrode and another drain electrode which are coupled with the another semiconductor layer, the interlayer insulating layer and the gate insulating layer have another contact hole extending to the another semiconductor layer, at least one of the another source electrode and the another drain electrode being provided on the interlayer insulating layer and in the another contact hole and being in contact with the contact region inside the another contact hole, at a side wall of the another contact hole, a side surface of the gate insulating layer is aligned with a side surface of the interlayer insulating layer, and at an upper surface of the another semiconductor layer, an edge of the another contact hole is aligned with an edge of the contact region.

A semiconductor device manufacturing method of one embodiment of the present invention is a method for manufacturing a semiconductor device which includes at least one thin film transistor on a substrate, the method including: (a) forming, on substrate, an island-like semiconductor layer which includes a channel region and a low-concentration impurity region that contains first conductivity type impurity at a concentration higher than in the channel region, a gate insulating layer covering the semiconductor layer, and a gate electrode on the gate insulating layer; (b) forming an interlayer insulating layer on the gate insulating layer and the gate electrode; (c) forming a mask on the interlayer insulating layer, and simultaneously etching the gate insulating layer and the interlayer insulating layer using the mask, thereby forming a contact hole in the gate insulating layer and the interlayer insulating layer such that a part of the low-concentration impurity region is exposed through the contact hole; (d) implanting a first conductivity type impurity into the part of the low concentration impurity region of the semiconductor layer via the contact hole, thereby forming a high-concentration impurity region; and (e) forming an electrode on the interlayer insulating layer and in the contact hole so as to be in contact with the high-concentration impurity region.

In one embodiment, before step (d), a first activation annealing is performed on the low-concentration impurity region, and after step (d), a second activation annealing is performed on the high-concentration impurity region.

In one embodiment, the second activation annealing is performed at a temperature lower than that of the first activation annealing.

In one embodiment, step (a) includes a first ion implantation step of implanting the first conductivity type impurity into part of the semiconductor layer, and in step (d), the first conductivity type impurity is implanted with a smaller dose amount, or at a lower acceleration voltage, than in the first ion implantation step.

In one embodiment, in step (a), at least a part of the low concentration impurity region overlaps the gate electrode with the gate insulating layer interposed therebetween.

A semiconductor device manufacturing method of another embodiment of the present invention is a method for manufacturing a semiconductor device which includes at least a first thin film transistor and a second thin film transistor on a substrate, the method including: (a) forming, on a substrate, a first semiconductor layer which is to be an active layer of the first thin film transistor and a second semiconductor layer which is to be an active layer of the second thin film transistor, and forming a gate insulating layer so as to cover the first and second semiconductor layers; (b) implanting a first conductivity type impurity into a part of the first semiconductor layer and a part of the second semiconductor layer, as a first implantation step; (c) forming a first gate electrode on a part of the region of the first semiconductor layer in which the impurity is implanted in the first implantation step and a part of the first semiconductor layer which is to be a channel region, and forming a first gate electrode on a part of a region of the second semiconductor layer in which the impurity is not implanted in the first implantation step; (d) implanting a first conductivity type impurity into the first and second semiconductor layers using the first and second gate electrodes as masks, as a second implantation step, so that a region of the first semiconductor layer in which the impurity is implanted in both the first and second implantation steps is a first low-concentration impurity region, another region of the first semiconductor layer in which the impurity is implanted in the first implantation step and in which the impurity is not implanted in the second implantation step due to the second gate electrode covering that portion is a second low-concentration impurity region, a region of the second semiconductor layer in which the impurity is implanted in both the first and second implantation steps is a third low-concentration impurity region, and another region of the second semiconductor layer in which the impurity is implanted in the second implantation step but the impurity not implanted in the first implantation step is a fourth low-concentration impurity region; (e) forming an interlayer insulating layer on the gate insulating layer, the first gate electrode and the second gate electrode; (f) forming a mask on the interlayer insulating layer, and simultaneously etching the gate insulating layer and the interlayer insulating layer using the mask, thereby forming, in the gate insulating layer and the interlayer insulating layer, a first contact hole through which a part of the first low-concentration impurity region is exposed and a second contact hole through which a part of the third low-concentration region is exposed; (g) implanting a first conductivity type impurity into the parts of the first and third low-concentration impurity regions via the first and second contact holes, thereby forming a first high-concentration impurity region in the first semiconductor layer and a second high-concentration impurity region in the second semiconductor layer; and (h) forming a first electrode on the interlayer insulating layer and in the first contact hole so as to be in contact with the first high-concentration impurity region, and forming a second electrode on the interlayer insulating layer and in the second contact hole so as to be in contact with the second high-concentration impurity region.

In one embodiment, before step (g), a first activation annealing is performed on the first, second, third and fourth low concentration impurity regions, and after step (g), a second activation annealing is performed on the first and second high-concentration impurity regions.

In one embodiment, the second activation annealing is performed at a temperature lower than that of the first activation annealing.

In one embodiment, in step (g) the first conductivity type impurity is implanted with a smaller dose amount, or at a lower acceleration voltage, than in the first and second ion implantation steps.

In one embodiment, the semiconductor device further includes a third thin film transistor whose conductivity type is different from those of the first and second thin film transistors, wherein step (a) includes forming a third semiconductor layer on the substrate, the gate insulating layer being also extending over the third semiconductor layer, step includes forming a third gate electrode on the third semiconductor layer, the method further includes, after step (c) and before step (e), implanting a second conductivity type impurity into the third semiconductor layer using the third gate electrode as a mask, thereby forming a third high-concentration impurity region in the third semiconductor layer, in step (e), the interlayer insulating layer is formed so as to also extend over the third gate electrode, step (f) includes forming a third contact hole in the gate insulating layer and the interlayer insulating layer such that a part of the third high-concentration impurity region is exposed through the third contact hole, step (g) includes implanting a first conductivity type impurity into the part of the third high-concentration impurity region via the third contact hole, thereby forming a contact region in the third semiconductor layer, and step (h) includes forming a third electrode on the interlayer insulating layer and in the third contact hole so as to be in contact with the contact region.

In one embodiment, the first implantation step of step (b) is performed using first, second and third masks provided on the first, second and third semiconductor layers, respectively, and the third mask is a multilevel mask, and the method further includes, after the first implantation step and before step (c), removing the first and second masks and a part of the third mask, and implanting an impurity into a region of the first and second semiconductor layers, including a portion which is to be a channel region, using a part of the third mask.

Advantageous Effects of Invention

According to embodiment of present invention, a semiconductor device of excellent productivity and high definition which includes TFTs that have a LDD region can be provided.

Further, in a manufacturing method of a semiconductor device which includes TFTs that have a LDD region, the number of photomasks used can be reduced.

BRIEF DESCRIPTION OF DRAWINGS

FIGS. 1 (a) and (b) are schematic cross-sectional views illustrating an LDD structure TFT 100 and a GOLD structure TFT 200, respectively, in a semiconductor device of the first embodiment.

FIGS. 2 (a) and (b) are schematic plan illustrating semiconductor layers 3A, 3B in the LDD structure TFT 100 and the GOLD structure TFT 200, respectively.

FIG. 5 (a) is a cross-sectional view illustrating an LDD structure TFT 101 and a GOLD structure TFT 201 in a semiconductor device of the second embodiment (b) and (c) are plan views illustrating semiconductor layers 3A, 3B of the LDD structure TFT 101 and the GOLD structure TFT 201, respectively.

FIG. 6 (a) to (e) are schematic stepwise cross-sectional views illustrating a method for manufacturing a semiconductor device of the second embodiment.

FIG. 7 (a) is a process flow for forming a GOLD structure TFT 2000 of a reference example (b) is a process flow for forming the GOLD structure TFTs 200, 201.

FIG. 8 (a) is a cross-sectional view of a p-type TFT 302 in the third embodiment. (b) is a plan view of a semiconductor layer 3C of the p-type TFT 302.

FIG. 10 (a) is a cross-sectional view illustrating an LDD structure TFT 1000 and a GOLD structure TFT 2000 of a reference example (b) and (c) are top views of semiconductor layers 3D, 3E of the LDD structure TFT 1000 and the GOLD structure TFT 2000, respectively.

DESCRIPTION OF EMBODIMENTS

First Embodiment

Figure 3:
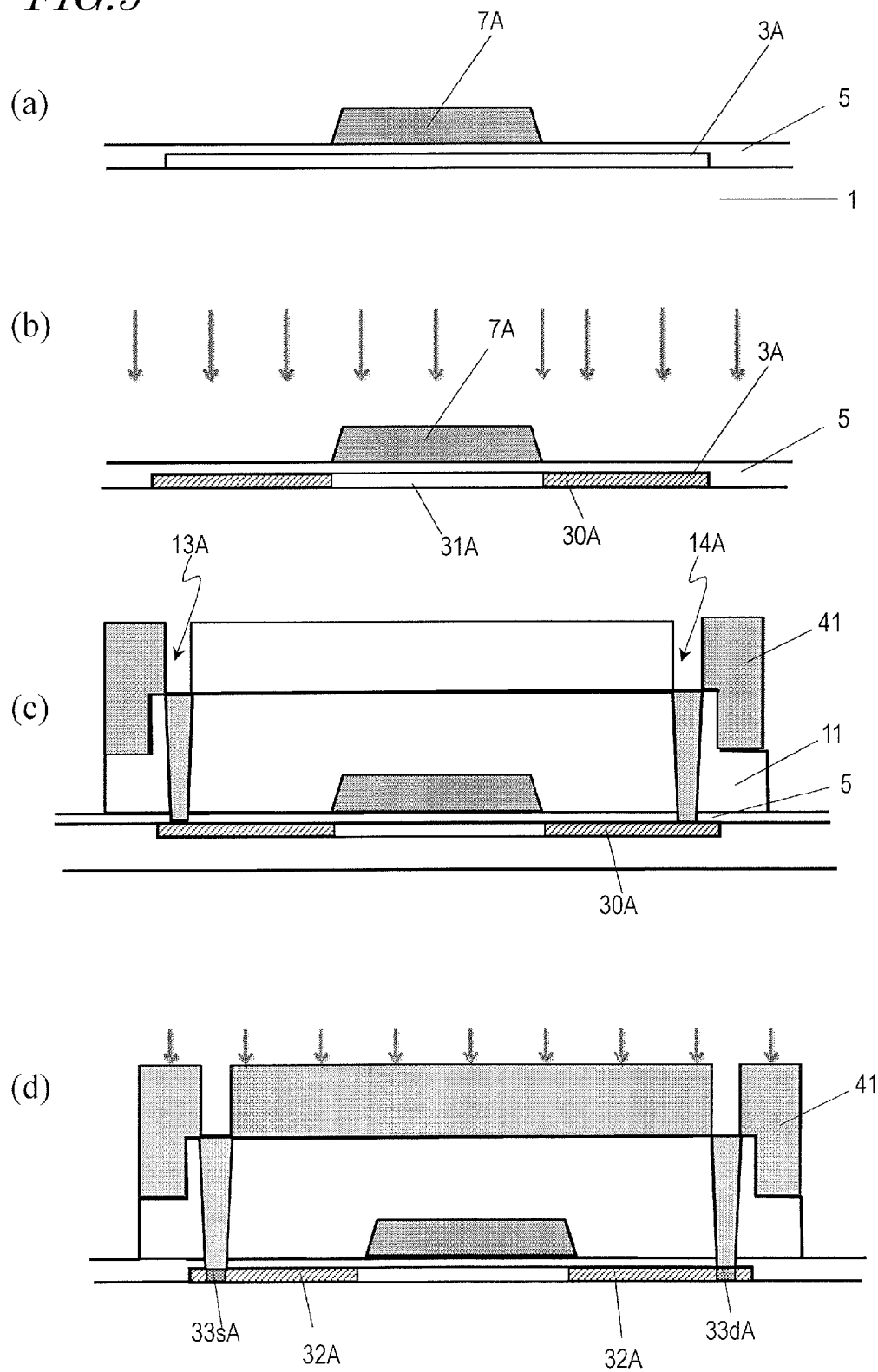
FIG. 3 (a) to (d) are schematic stepwise cross-sectional views illustrating an example of a method for forming the LDD structure TFT 100.
Figure 4:
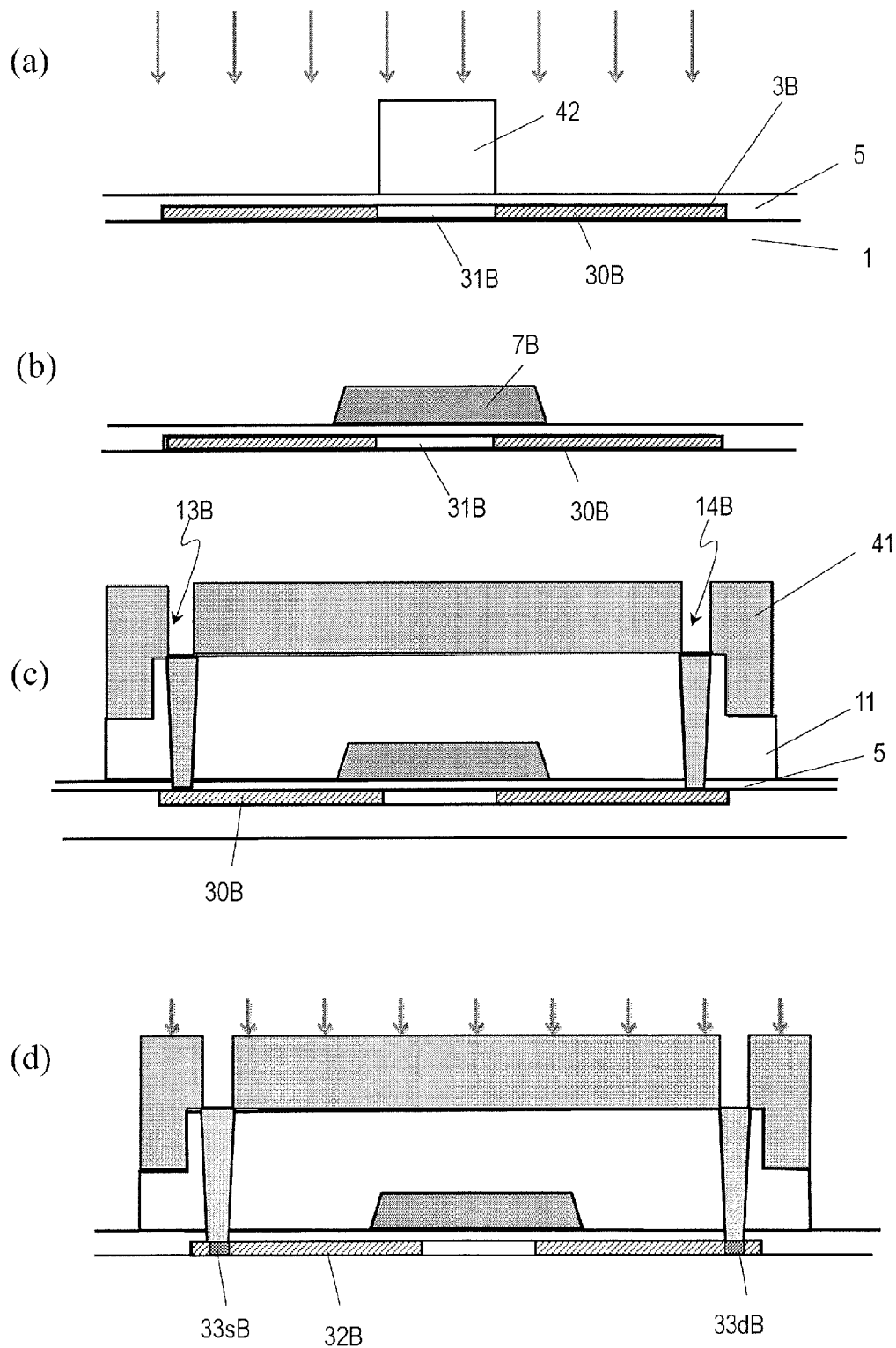
FIG. 4 (a) to (d) are schematic stepwise cross-sectional views illustrating an example of a method for forming the TFT 200 that has a GOLD structure.

Hereinafter, an embodiment of the semiconductor device of the present invention is describes with reference to the drawings. In this specification, the "semiconductor device" widely includes substrates which include functional circuits, active matrix substrates, and display devices, such as liquid crystal display devices, organic EL display devices, etc.

The semiconductor device of the present embodiment includes a substrate and a plurality of TFTs formed on the substrate. The plurality of TFTs include at least one TFT which has an LDD region. The TFT which has an LDD region may be an LDD structure TFT or may be a GOLD structure TFT. Alternatively, the TFT which has an LDD region may include both a GOLD structure TFT and an LDD structure TFT which are formed using a common semiconductor film.

FIGS. 1(a) and 1(b) are schematic cross-sectional illustrating a TFT which has an LDD region in a semiconductor device of the present embodiment. FIG. 1(a) illustrates an LDD structure TFT 100. FIG. 1(b) illustrates a GOLD structure TFT 200. FIGS. 2(a) and 2(b) are schematic plan views illustrating semiconductor layers in the LDD structure TFT 100 and the GOLD structure TFT 200, respectively. In FIG. 1 and FIG. 2, like components are designated by the same reference marks or by reference marks including the same numeral. Some of the components of the LDD structure TFT 100 are designated by numerals suffixed with "A". Some of the components of the GOLD structure TFT 200 are designated by numerals suffixed with "B".

As shown in FIG. 1(a), the LDD structure TFT 100 includes a semiconductor layer 3A formed on the substrate 1, a gate insulating layer 5 covering the semiconductor layer 3A, a gate electrode 7A formed on the gate insulating layer 5, an interlayer insulating layer 11 covering the gate electrode 7A and the semiconductor layer 3A, and a source electrode 8A and a drain electrode 9A which are electrically coupled with the semiconductor layer 3A.

The semiconductor layer 3A includes a channel region 31A, a source region 33sA, a drain region 33dA and an LDD region 32A. The channel region 31A is located between the source region 33sA and the drain region 33dA. The LDD region 32A is located between the channel region 31A and at least one of the source region 33sA and the drain region 33dA. In this example, the source region 33sA and the drain region 33dA are first conductivity type regions containing a first conductivity type impurity (e.g., n-type impurity), for example, $n^+$ type regions. The LDD region 32A is a first conductivity type region which contains a first conductivity type impurity (e.g., n-type impurity) at a concentration higher than in the channel region 31A but lower than in the source region 33sA and the drain region 33dA, for example, $n^-$ type region. In this specification, the source region 33sA and the drain region 33dA are also generically referred to as "high-concentration impurity region" or "$n^+$ type region", and the LDD region 32A is also referred to as "low-concentration impurity region" or "$n^-$ type region".

The gate electrode 7A is arranged so as to extend over at least the channel region 31A of the semiconductor layer 3A with the gate insulating layer 5 interposed therebetween. In this example, when viewed in the normal direction of the substrate 1, the gate electrode 7A extends over the channel region 31A but does not extend over any of the source region 33sA, the drain region 33dA and the LDD region 32A. When viewed in the normal direction of the substrate 1, an edge of the gate electrode 7A is aligned with an edge of the LDD region 32A on the channel region 31A side.

The gate insulating layer 5 and the interlayer insulating layer 11 have a source contact hole 13A extending to the source region 33sA of the semiconductor layer 3A and a drain contact hole 14A extending to the drain region 33dA of the semiconductor layer 3A. These contact holes 13A, 14A are formed by simultaneously etching the gate insulating layer 5 and the interlayer insulating layer 11. Therefore, at the side walls of the source contact hole 13A and the drain contact hole 14A, the side surface of the gate insulating layer 5 is aligned with the side surface of the interlayer insulating layer 11.

The source electrode 8A is provided on the inter layer insulating layer 11 and in the source contact hole 13A. The source electrode 8A is in contact with the source region 33sA inside the source contact hole 13A. The drain electrode 9A is provided on the interlayer insulating layer 11 and in the drain contact hole 14A. The drain electrode 9A is in contact with the drain region 33dA inside the drain contact hole 14A.

In the present embodiment, the source region 33sA and the drain region 33dA are formed by implanting the first conductivity type impurity into the semiconductor layer 3A via the contact holes 13A, 14A. In this specification, an implantation step via a contact hole is referred to as "contact doping step". Therefore, at the upper surface of the semiconductor layer 3A, the edge of the source contact hole 13A is aligned with the source region 33sA of the semiconductor layer 3A. Likewise, the edge of the drain contact hole 14A is aligned with the drain region 33dA of the semiconductor layer 3A. Here, the term "in alignment" only requires formation by implantation via a contact hole such as described above and includes a case where, for example, the first conductivity type impurity implanted into the semiconductor layer 3A is diffused into surroundings activation annealing. In such a configuration, a surface of the source electrode 8A which is in contact with the semiconductor layer 3A (contact surface) is aligned with the source region 33sA, and a surface of the drain electrode 9A which is in contact with the semiconductor layer 3A is aligned with the drain region 33dA.

On the other hand, the GOLD structure TFT 200 shown in FIG. 1(b) includes a semiconductor layer 3B formed on the substrate 1, a gate insulating layer 5 covering the semiconductor layer 3B, a gate electrode 7B formed on the gate insulating layer 5, an interlayer insulating layer 11 covering the gate electrode 7B and the semiconductor layer 3B, and a source electrode 8B and a drain electrode 9B which are electrically coupled with the semiconductor layer 3B. The semiconductor layer 3B includes a channel region 31B, a source region 33s3, a drain region 33dB, and an LDD region 32B. The LDD region 32B is located between the channel region 31B and at least one of the source region 33sB and the drain region 33dB. The LDD region 32B contains the first conductivity type impurity at a concentration higher than in the channel region 318 but lower than in the source region 33sB and the drain region 33dB (hereinafter, "high-concentration impurity regions").

The GOLD structure TFT 200 is different from the LDD structure TFT 100 in that the gate electrode 7B is arranged so as to extend over not only the channel region 31B of the semiconductor layer 3B but also part of the LDD region. 32B with the gate insulating layer 5 interposed therebetween. The LDD region 32B includes portion which does not overlap the gate electrode 7B, i.e., portion which s located between the source and drain regions 33s8, 33dB and the gate electrode 7B ("LDD portion 32(1)") when viewed in the normal direction of the substrate 1 and a portion overlapping the gate electrode 7B (hereinafter, "GOLD portion 32(2)"). The GOLD portion 32(2) is also referred to as "GOLD region" or "NM region". The LDD portion 32(1) and the GOLD portion 32(2) may contain the impurity element at the same concentration or at different concentrations. As will be described later, the LDD portion 32(1) may contain the first conductivity type impurity at a higher concentration than in the GOLD portion 32(2).

The other components are the same as those of the LDD structure TFT 100 shown in FIG. 1(a) and, therefore, the description thereof is herein omitted.

Also in the GOLD structure TFT 200, the source region 33sB and the drain region 33dB are formed by implanting the first conductivity type Impurity into the semiconductor layer 3B via a source contact hole 13B and a drain contact hole 14B, respectively, as in the LDD structure TFT 100 (contact doping step). Therefore at the upper surface of the semiconductor layer 3B, the edges of the contact holes 13B, 14B are aligned with the edges of the source region 33sB and the drain region 33dB of the semiconductor layer 3B.

The semiconductor device of the present embodiment may include both the LDD structure TFT 100 and the GOLD structure TFT 200. For example, the semiconductor device may include a plurality of LDD structure TFTs 100 as the pixel TFTs and a plurality of GOLD structure TFTs 200 as the driver circuit TFTs on the same substrate 1. In such a case, the semiconductor layers 3A, 3B can be formed by the same semiconductor film, and the gate electrodes 7A, 7B can be formed by the same electrically-conductive film. The gate insulating layer 5 and the interlayer insulating layer 11 may be common among the TFTs 100, 200. The source regions 33sA, 33sB and the drain regions 33dA, 33dB of the TFTs 100, 200 may be formed through a common contact doping step. In this case, the number of photomasks used in the manufacturing process of the semiconductor device can be reduced.

Note that, in the semiconductor device of the present embodiment, it is only necessary that at least one high-concentration impurity region in a TFT which has an LDD region is formed through a contact doping step, and an electrode (source or drain electrode) is arranged so as to be in contact with that high-concentration impurity region inside the contact hole. Therefore, only either one of the source and drain regions may be formed through a contact doping step.

In this specification, the "LDD region" refers to a region in which the impurity concentration is, for example, not less than $1 \times 10^{18}$ atoms/cm$^3$ and is lower than the impurity concentration of the source/drain regions. Therefore, a region of the semiconductor layer in which the impurity is contained at a very low concentration (less than $1 \times 10^{18}$ atoms/cm$^3$) is not included. For example, although there is a case where part of the impurity implanted into the LDD region diffuses into the channel region lying under the gate electrode, it is estimated that the impurity concentration in a portion in which the impurity is diffused is very low, and thus, such a portion is not included in the "LDD region".

Next, an example of a method for forming the LDD structure TFT 100 and the GOLD structure TFT 200 in the present embodiment is described step by step.

FIGS. 3(a) to 3(d) are schematic stepwise cross-sectional views illustrating an example of a method for forming the LDD structure TFT 100.

Firstly, as shown in FIG. 3(a), a semiconductor layer (e.g., polysilicon layer) 3A, a gate insulating layer 5 and a gate electrode 7A are formed in this order on the substrate 1 by a known method.

Then, as shown in FIG. 3(b), an impurity ion of the first conductivity type (here, n-type) is implanted into the semiconductor layer 3A at a low concentration using the gate electrode 7A as a mask, whereby a low concentration implanted region 30A is formed in the semiconductor layer 3A. A region in which the impurity ion is not implanted is a channel region 31A. Thereafter, activation annealing is performed at the first temperature, whereby the impurity ion in the low concentration implanted region 30A is activated, and the crystallinity of the low concentration implanted region 30A is recovered.

Then, as shown in FIG. 3(c), an interlayer insulating layer 11 is formed so as to cover the semiconductor layer 3A, and thereafter, a resist mask 41 which has openings is formed on the interlayer insulating layer 11. Then, a source contact hole 13A and a drain contact hole 14A are formed in the gate insulating layer 5 and the interlayer insulating layer 11 using the resist mask 41.

Then, as shown in FIG. 3(d), an impurity ion of the first conductivity type is implanted into parts of the low concentration implanted region 30A at a high concentration via the source contact hole 13A and the drain contact hole 14A. Thereby, a source region 33sA and a drain region 33dA are formed in the semiconductor layer 3A. Part of the low concentration implanted region 30A in which the impurity ion is not implanted at the high concentration is the LDD region 32A. Thereafter, the resist mask 41 is peeled off. Note that peeling of the resist mask 41 may be carried out before implantation of the impurity ion.

Then, activation annealing is performed at the second temperature, whereby the impurity ion implanted in the source region 33sA and the drain region 33dA is activated. The second temperature is set to, for example, a temperature lower than the first temperature. In this way, the LDD structure TFT 100 is obtained.

FIGS. 4(a) to 4(d) are schematic stepwise cross-sectional views illustrating an example of a method for forming the TFT 200 that has a GOLD structure.

Firstly, as shown in FIG. 4(a), a semiconductor layer 3B and a gate insulating layer 5 are formed on the substrate 1 by a known method. Then, a resist mask 42 is formed on the gate insulating layer 5. An impurity ion of the first conductivity type (here, n-type) is implanted into the semiconductor layer 3B at a low concentration using the resist mask 42, whereby a low concentration implanted region 30B is formed in the semiconductor layer 3B. A region in which the impurity ion is not implanted is the channel region 31B.

After the resist mask 42 is peeled off, a gate electrode 7B is formed on the gate insulating layer 5 so as to extend over part of the low concentration implanted region 30B and the channel region 31B as shown in FIG. 4(b). Thereafter, activation annealing is performed at the first temperature, whereby the impurity ion implanted in the low concentration implanted region 30B is activated. Note that the activation annealing may be performed before formation of the gate electrode 7B.

Then, in the same way as that previously described with reference to FIG. 3(c), an interlayer insulating layer 11 is formed, and the gate insulating layer 5 and the interlayer insulating layer 11 are patterned, whereby a source contact hole 13B and a drain contact hole 14B are obtained as shown in FIG. 4(c).

Then, in the same way as that previously described with reference to FIG. 3(d), an impurity ion of the first conductivity type is implanted into parts of the low concentration implanted region 303 at a high concentration, whereby a source region 33sB and a drain region 33dB are obtained as shown in FIG. 4(d). Part of the low concentration implanted region 30B in which the impurity ion is not implanted at the high concentration is the LDD region 32B. Then, activation annealing is performed at the second temperature, which is lower than the first temperature, whereby a GOLD structure TFT 200 is obtained.

According to the present embodiment, in formation of the LDD structure TFT 100, a low concentration implanted region (N⁻ region), which is to be the LDD region 32A, is formed using the gate electrode 7A as the mask, and a high concentration implanted region (N⁺ region), which is to be the source region or the drain region, is formed using the insulating layer which has the contact holes 13A, 14A as the mask. Also in the case of forming the GOLD structure TFT 200, a high concentration implanted region (N⁺ region) is formed using the insulating layer which has the contact holes 13B, 14B as the mask. Therefore, the number of photomasks used can be reduced by one as compared with the conventional method.

In the above-described method, activation annealing is performed on the low concentration implanted region before contact doping. After the contact doping, activation annealing is performed on the high concentration implanted region. The activation annealing may be performed only once after the contact doping. Note that, however, as in the above-described method, it is preferred that the activation annealing is also performed before the contact doping. The reasons are as follows.

Usually, a region in which an impurity ion is implanted is subjected to annealing (activation annealing) for restoring crystalline defects produced during the ion implantation and activating the implanted ion. However, if activation annealing is performed at a high temperature after the contact doping, terminal hydrogen at the interface between the gate insulating layer and the semiconductor layer separates from the contact hole, so that there is a probability that the TFT characteristics deteriorate. On the other hand, in the above-described method, after the low concentration implanted region (N⁻ region), which is to be the LDD regions 32A, 32B, has been formed, activation annealing is performed at the first temperature before the contact doping step, whereby the crystals of the low concentration implanted regions 30A, 30B are once restored. The first temperature may be, for example, not less than 500° C. and not more than 700° C. Then, after the contact doping, activation annealing is performed at the second temperature on the high concentration implanted region (N⁺ region). The second temperature can be set lower than the first temperature. The second temperature may be, for example, not less than 200° C. and less than 300° C. Thus, by performing the activation annealing before and after the contact doping, the crystallinity of the low-concentration impurity region and the crystallinity of the high-concentration impurity region can be more assuredly restored while the TFT characteristics are secured.

The acceleration energy during the contact doping may be lower than the acceleration energy in formation of the low concentration implanted regions 30A, 30B and, for example, may be not less than 5 keV and not more than 30 keV. With such an acceleration energy, separation of the terminal hydrogen in the activation annealing which is performed after the contact doping can be effectively suppressed.

Note that the conductivity type of the TFTs 100, 200 is not limited to the n-type but may be the p-type. In this case, the first conductivity type impurity implanted in the semiconductor layers 3A, 3B can be a p-type impurity, such as boron.

Japanese Laid-Open Patent Publication No. 2007-141992 discloses forming source/drain regions by implanting an impurity ion into a semiconductor layer via a contact hole formed in a gate insulating layer. In this method, after formation of the source/drain regions, formation and patterning of an interlayer insulating layer are performed. According to this method, is necessary to separately pattern the gate insulating layer and the interlayer insulating layer, and the number of photomasks cannot be reduced. If the thickness of the gate insulating layer is small, the gate insulating layer cannot be used as the doping mask in some cases. On the other hand, in the present embodiment, the gate insulating layer 5 and the interlayer insulating layer 11, which are the gate insulating layers, are concurrently etched together, that the number of photomasks can be reduced. Since the gate insulating layer 5 and the interlayer insulating layer 11 are used as the etching mask, they are applicable irrespective of the thickness of the gate insulating layer 5. As previously described, performing the activation annealing twice separately before and after the contact doping is more advantageous.

Second Embodiment

Hereinafter, a semiconductor device of the second embodiment of the present invention is described with reference to the drawings.

The semiconductor device of the present embodiment includes an LDD structure TFT and a GOLD structure TFT on the same substrate. These TFTs are formed through a common process using the same semiconductor films. The LDD structure TFT is formed as the pixel TFT in the display region. The GOLD structure TFT is formed as the driver circuit TFT in the frame region.

FIG. 5(a) is a cross-sectional view illustrating an LDD structure TFT 101 and a GOLD structure TFT 201 in a semiconductor device of the present embodiment. FIGS.

5(b) and 5(c) are plan views illustrating semiconductor layers 3A, 3B of the LDD structure TFT 101 and the GOLD structure TFT 201, respectively.

In the LDD structure TFT 101, the LDD region 32A includes the third LDD regions (also referred to as "high concentration LDD regions") 36 which are respectively in contact with the source region 33sA and the drain region 33dA and the fourth LDD regions (also referred to as "low concentration LDD regions") 37 which are located between the third LDD regions 36 and the channel region 31A. The third LDD regions 36 contain an impurity of the first conductivity type at a higher concentration than in the fourth LDD regions 37. An this example, the fourth LDD regions 37 are in contact with the channel region 31A. In the illustrated example, when viewed in the normal direction of the substrate 1, the source region 33sA and the drain region 33dA are respectively provided inside the third LDD regions 36. The other components are the same as those of the LDD structure TFT 100 shown in FIG. 1, and therefore, the descriptions thereof are herein omitted.

In the GOLD structure TFT 201, the LDD region 32B includes the first LDD regions (also referred to as "high concentration LDD regions") 34 which are respectively in contact with the source region 33sB and the drain region 33dB and the second LDD regions (also referred to as "low concentration LDD regions") 35 which are located between the first LDD regions 34 and the channel region 31B. The second LDD regions 35 are overlapped by the gate electrode 7B. When viewed in the normal direction of the substrate 1, the source region 33sB and the drain region 33dB are respectively provided inside the first LDD regions 34. The other components are the same as those of the GOLD structure TFT 200 shown in FIG. 1, and therefore, the descriptions thereof are herein omitted.

Next, an example of the manufacturing method of the semiconductor device of the present embodiment is described.

FIGS. 6(a) to 6(e) are schematic stepwise cross-sectional views illustrating a method for manufacturing the semiconductor device of the present embodiment. For the sake of simplicity, a method for forming a single unit of the LDD structure TFT 101 and a single unit of the GOLD structure TFT 201 is described herein although, typically, multiple units of the respective TFTs are formed.

Firstly, as shown in FIG. 6(a), an island-like semiconductor layer 3A is formed in a region of the substrate 1 in which the LDD structure TFT is to be formed, and an island-like semiconductor layer 3B is formed in a region of the substrate in which the GOLD structure TFT is to be formed. Then, a gate insulating layer 5 is formed so as to cover these semiconductor layers 3A, 3B.

The substrate 1 only needs to be a substrate which has an insulative surface. Not only a quartz substrate and a glass substrate but also a Si substrate and a metal substrate whose surface is covered with an insulating layer may be used.

The semiconductor layers 3A, 3B are formed using a crystalline silicon film. Specifically, firstly, a semiconductor film which has an amorphous structure (here, amorphous silicon film) is deposited using a known method such as plasma CVD or sputtering. The thickness of the amorphous semiconductor film is not less than 20 nm and not more than 70 nm, preferably not less than 40 nm and not more than 60 nm. Thereafter, the amorphous semiconductor film is crystallized, whereby a crystalline semiconductor film (here, polysilicon film) is formed. The resultant crystalline semiconductor film is patterned, whereby semiconductor layers 3A, 3B are obtained. The crystallization of the amorphous semiconductor film can be realized by laser crystallization. Alternatively, the crystallization may be realized by adding a catalyst element to the amorphous semiconductor film and thereafter performing annealing on the amorphous semiconductor film.

The gate insulating layer 5 can be formed by, for example, CVD. Here, a silicon oxide ($SiO_2$) layer having a thickness of, for example, not less than 50 nm and not more than 200 nm is formed.

Then, resist mask 45 covering part of the semiconductor layer 3A and a resist mask 47 covering part of the semiconductor layer 3B which is to be the channel region are formed through a known photolithography process. The resist mask 45 is arranged so as to expose part of the semiconductor layer 3A in which a high-concentration impurity region is to be formed and to cover parts of the semiconductor layer 3A in which the channel region and the LDD region are to be formed.

Thereafter, a n-type impurity ion is implanted into the semiconductor layers 3A, 3B at a low concentration using the resist masks 45, 47, whereby low concentration implanted regions 50A, 50B are obtained (first ion implantation step). Here, phosphorus ion is implanted as the impurity ion. In the ion implantation, the acceleration voltage is for example 60 kV, and the dose amount is $1\times10^{13}/cm^2$. Part of the semiconductor layer 3B in which the impurity ion is not implanted is the channel region 31B.

Then, the resist masks 45, 47 are removed, and gate electrodes 7A, 7B are formed on the semiconductor layers 3A, 3B, respectively, as shown in FIG. 6(b). The gate electrode 7A is provided on part of the low concentration implanted region 50A which is to be the channel region. The gate electrode 7B is provided so as to cover part of the low concentration implanted region 50B of the semiconductor layer 3B and the channel region 31B.

The gate electrodes 7A, 7B can be realized by, for example, forming a tungsten (W) film (thickness: e.g., 400 nm) on the gate insulating layer 5 by sputtering and then etching the W film. The material of the gate electrodes 7A, 7B is not particularly limited. For example, the gate electrodes 7A, 7B may be a multilayer film including, for example, a TaN film and a W film.

Then, as shown in FIG. 6(c), a n-type impurity ion is implanted into the semiconductor layers 3A, 3B at a low concentration using the gate electrodes 7A, 7B as the mask (second ion implantation step). Here, phosphorus ion is implanted as the impurity ion. In the ion implantation, the acceleration voltage is for example 50 kV, and the dose amount is $1\times10^{13}/cm^2$. Part of the semiconductor layer 3A which is covered with the gate electrode 7A and in which the impurity is not implanted is the channel region 31A, portion 36 in which the impurity ion is implanted at both the first and second ion implantation steps is the third LDD region. A portion 37 in which the impurity ion is not implanted at the first ion implantation step but the impurity ion is implanted at the second ion implantation step is the fourth LDD region. The third LDD region 36 contains the first conductivity type impurity at a concentration higher than the fourth LDD region 37.

Thereafter, activation annealing (first activation annealing) is performed. The annealing temperature is not particularly limited but may be, for example, not less than 500° C. and not more than 700° C.

Then, as shown in FIG. 6(d), an interlayer insulating layer 11 is formed so as to cover the semiconductor layers 3A, 3B, the gate electrodes 7A, 7B and the gate insulating layer 5. The interlayer insulating layer 11 may be, for example, a SiO$_2$ film having a thickness of not less than 300 nm and not more than 900 nm. Alternatively, the interlayer insulating layer 11 may be a multilayer film consisting of, for example, a SiN film and a SiO$_2$ film. Thereafter, when necessary, a heat treatment for hydrogenating the semiconductor layers 3A, 3B (hydrogenation annealing), for example, annealing at 350-550° C. in a 1 atm nitrogen atmosphere or hydrogen-mixed atmosphere, may be performed.

Then, as shown in FIG. 6(*e*), a resist mask 49 is formed on the interlayer insulating layer 11, and the interlayer insulating layer 11 is patterned using the resist mask 49. As a result, the interlayer insulating layer 11 has a source contact hole 13A and a drain contact hole 14A, extending to part of the third LDD regions 36 of the semiconductor layer 3A, and a source contact hole 13B and a drain contact hole 14B, extending to part of the first LDD regions 34 of the semiconductor layer 3B.

Then, via these contact holes 13A, 14A, 13B, 14B, an impurity ion is implanted into the semiconductor layers 3A, 3B (contact doping step). Thereby, source and drain regions 33*s*A, 33*d*A are formed in the third LDD regions 36 of the semiconductor layer 3A. Also, source and drain regions 33*s*B, 33*d*B are formed in the first LDD regions 34 of the semiconductor layer 3B. Thereafter, the resist mask 49 is removed. Note that the contact doping may be performed after the resist mask 49 is removed.

The implantation conditions in the contact doping step are now described. Here, phosphorus ion is implanted as the impurity ion. In the ion implantation, the acceleration voltage is preferably set lower than the acceleration voltages of the first and second ion implantation steps, for example, set to a voltage lower than 20 kV. Since the ion implantation is performed on a region on which the ion implantation has already been performed twice, the dose amount in this step can be set to a value lower than the conventional dose amount in formation of the high concentration implanted region. Also, the dose amount in this step can be set lower than the dose amounts in the first and second ion implantation steps. Preferably, the dose amount is not less than $10^{13}/cm^2$ and not more than $10^{14}/cm^2$. As described herein, in the contact doping step, the ion implantation can be performed with a lower energy than in the first and second ion implantation steps, and accordingly, crystalline defects produced in the ion implantation can be reduced. Therefore, even if the temperature for the activation annealing performed after the ion implantation is decreased, the crystallinity can be sufficiently restored.

Thereafter, the second activation annealing is performed, whereby the crystallinity of the source and drain regions 33*s*A, 33*d*A, 33*s*B, 33*d*B is restored, and the implanted ion is activated. Thereafter, although not shown, source electrodes and drain electrodes are formed in the contact holes 13A, 13B, 14A, 14B. In this way, the LDD structure TFT 101 and the GOLD structure TFT 201 are formed.

The second activation annealing may be performed at a temperature lower than that of the above-described first activation annealing. The temperature of the second activation annealing may be set to, for example, a temperature lower than 300° C. In this case, separation of hydrogen from the contact holes 13A, 14A, 13B, 14B can be reduced, and accordingly, deterioration of the TFT characteristics can be suppressed.

In the above-described method, the contact doping is utilized to form the high concentration implanted regions of the TFTs 101, 201, and therefore, it is not necessary to form a doping mask for formation of the high concentration implanted regions in a photo process. Thus, the number of photomasks used can be reduced as compared with the conventional method.

In the present embodiment, the impurity concentration and the implantation profile in the fourth LDD region 37 of the LDD structure TFT 101 depend on the implantation conditions of the second ion implantation step. The impurity concentration and the implantation profile in the second LDD region 35 of the GOLD structure TFT 201 depend on the implantation conditions of the first ion implantation step. The first and third LDD regions 34, 36 are regions in which the impurity ion is implanted at both the first and second ion implantation steps. Therefore, the first and third LDD regions 34, 36 have substantially equal impurity concentrations and substantially equal implantation profiles. Also, the source and drain regions 33*s*A, 33*d*A, 33*s*B, 33*d*B, which are high-concentration impurity regions, have substantially equal impurity concentrations and substantially equal implantation profiles.

Therefore, the following relationships hold:

$$c2<c1<c5 \qquad (1)$$

$$c4<c3<c5 \qquad (2)$$

$$c1=c3 \qquad (3)$$

where c1, c2, c3, c4 are the impurity concentrations of the first to fourth LDD regions 34, 35, 36, 37, and c5 is the impurity concentration of the high-concentration impurity regions.

In the foregoing, the method for forming the LDD structure TFT 101 and the GOLD structure TFT 201 which have two LDD regions of different impurity concentrations is described, although the LDD structure TFT 100 and GOLD structure 200 shown in FIG. 1 may be formed instead.

Now, for the sake of comparison, a semiconductor device of a reference example which is manufactured without the contact doping is described. The semiconductor device of the reference example includes an LDD structure TFT 1000 and a GOLD structure TFT 2000 on the same substrate.

FIG. 10(*a*) is a cross-sectional view illustrating the LDD structure TFT 1000 and the GOLD structure TFT 2000. FIGS. 10(*b*) and 10(*c*) are top views of semiconductor layers 3D, 3E of the LDD structure TFT 1000 and the GOLD structure TFT 2000, respectively. In FIG. 10, for the sake of simplicity, components equivalent to those of FIG. 1 to FIG. 5 are designated by the same reference marks.

FIG. 7(*a*) is a process flow for the semiconductor device of the reference example which includes the LDD structure TFT 1000 and the GOLD structure TFT 2000. FIG. 7(*b*) is a process flow for the semiconductor device of the present embodiment which includes the LDD structure TFT 101 and the GOLD structure TFT 201. Note that FIGS. 7(*a*) and 7(*b*) are respectively the same as the process flows for the cases where only the GOLD structure TFT 2000 and the GOLD structure TFT 201 are formed.

In the semiconductor device of the reference example, in order to separately form the high concentration implanted regions of the TFTs 1000, 2000 (the source regions 33*s*A, 33*s*B and the drain regions 33*d*A, 33*d*B) and the LDD region 32A of the LDD structure TFT 1000, a mask for formation of the high concentration implanted regions photo) is used. After the high concentration implanted regions have been formed, the contact holes 13A, 13B, 14A, 14B are formed which expose part of these regions, and source and drain electrodes 8A, 8B, 9A, 9B are formed inside the contact holes. Therefore, when viewed in the normal direction of the substrate 1, at the upper surface of the semiconductor layer, the edges of the source regions 33sA, 33sB and the drain regions 33dA, 33dB are not aligned with the edges of the contact holes 13A, 13B, 14A, 14B. On the other hand, in the present embodiment, the source regions 33sA, 33sB and the drain regions 33dA, 33dB are formed by the contact doping, and therefore, a mask for formation of the N$^+$ region is unnecessary. Therefore, the number of photomasks can be reduced as compared with the semiconductor device of the reference example. As described herein, according to the present embodiment, the ADD structure TFT and the GOLD structure TFT can advantageously be formed on the same substrate without increasing the number of photomasks used.

As seen from FIG. 7, according to the present embodiment, one photo step which is indispensable in the process flow of the reference example can be removed, i.e., one photomask can be removed. If the number of photomasks is decreased by one, the step of photolithographically forming a resist pattern (resist application, prebaking, exposure, development, post baking, etc.), the step of peeling off the resist pattern, and the washing and drying steps can be omitted, and accordingly, the number of steps of manufacture and the manufacturing cost can be reduced.

Third Embodiment

Hereinafter, a semiconductor device of the third embodiment of the present invention is described with reference to the drawings. The semiconductor device of the present embodiment includes a first conductivity type TFT which has an LDD structure, a first conductivity type TFT which has a GOLD structure, and a second conductivity type TFT on the same substrate. In the present embodiment, the channel regions of the LDD structure and GOLD structure TFTs are provided with doping for adjustment of the threshold voltage (channel doping).

In the following description, the first conductivity type is the n-type and the second conductivity type is the p-type, although the first conductivity type may be the p-type and the second conductivity type may be the n-type. The LDD structure TFT can be formed as the pixel TFT in the display region. The GOLD structure TFT and the p-type TFT are formed as the driver circuit TFTs in the frame region. The p-type TFT has, for example, a single drain structure.

The semiconductor device of the present embodiment includes an n-type LDD structure TFT 102, an n-type GOLD structure TFT 202 and a p-type TFT 302 on the same substrate.

The configurations of the LDD structure TFT 102 and the GOLD structure TFT 202 are the same as those of the LDD structure TFT 101 and the GOLD structure TFT 201, respectively, which have previously been described with reference to FIG. 5 except that an impurity is implanted in the channel regions 31A, 31B. Also, in these TFTs 102, 202, the arrangement of the LDD regions and the high-concentration impurity regions, the impurity concentration, the implantation profile, etc., are the same as those of the previously-described embodiments and, therefore, the description thereof is herein omitted.

FIG. 8(a) is a cross-sectional view of the p-type TFT 302. FIG. 8(b) is a plan view of a semiconductor layer 3C of the p-type TFT 302. The p-type TFT 302 has, for example, a single drain structure. The p-type TFT 302 includes the semiconductor layer 3C formed on the substrate 1, a gate insulating layer 5 covering the semiconductor layer 3C, a gate electrode 7C formed on the gate insulating layer 5, an interlayer insulating layer 11 covering the gate electrode 7C and the semiconductor layer 3C, a source electrode 8C and a drain electrode 9C.

The semiconductor layer 3C includes a channel region 31C, a source region 38s, a drain region. 38d, a source contact region 39s and a drain contact region 39d. The source region 38s is located between the source contact region 39s and the channel region 31C. Likewise, the drain region 38d is located between the drain contact region 39d and the channel region 31C. In this example, the source region 38s, the drain region 38d, the source contact region 39s and the drain contact region 39d are each a second conductivity type region (e.g., p$^+$ type region) which contains the second conductivity type impurity (e.g., p-type impurity) at a high concentration.

The source electrode 8C is in contact with the source contact region 39s of the semiconductor layer 3C inside a source contact hole formed in the gate insulating layer 5 and the interlayer insulating layer 11. The drain electrode 9C is in contact with the drain contact region 39d of the semiconductor layer 3C inside a drain contact hole formed in the gate insulating layer 5 and the interlayer insulating layer 11. At the upper surface of the semiconductor layer 3C, the edge of the source contact hole is aligned with the edge of the source contact region 39s. Likewise, the edge of the drain contact hole is aligned with the edge of the drain contact region 39d.

In this example, the source contact region 39s and the drain contact region 39d are formed by contact doping. The concentration of the second conductivity type impurity in the source contact region 39s and the drain contact region 39d is equal to the concentration of the second conductivity type (e.g., p-type) impurity in the source region 38s and the drain region 38d. The concentration of the first conductivity type (e.g., n-type) impurity in the source contact region 39s and the drain contact region 39d is higher than the concentration of the first conductivity type impurity in the source region 38s and the drain region 38d by the amount of the impurity implanted by the contact doping.

Next, an example of the manufacturing method of the semiconductor device of the present embodiment is described.

FIGS. 9(a) to 9(f) are schematic stepwise cross-sectional views illustrating a method for manufacturing the semiconductor device of the present embodiment. For the sake of simplicity, a method for forming a single unit of the LDD structure TFT 102, a single unit of the GOLD structure TFT 202, and a single unit of the p-type TFT 302 is described herein although, typically, multiple units of the respective TFTs are formed.

Figure 9:
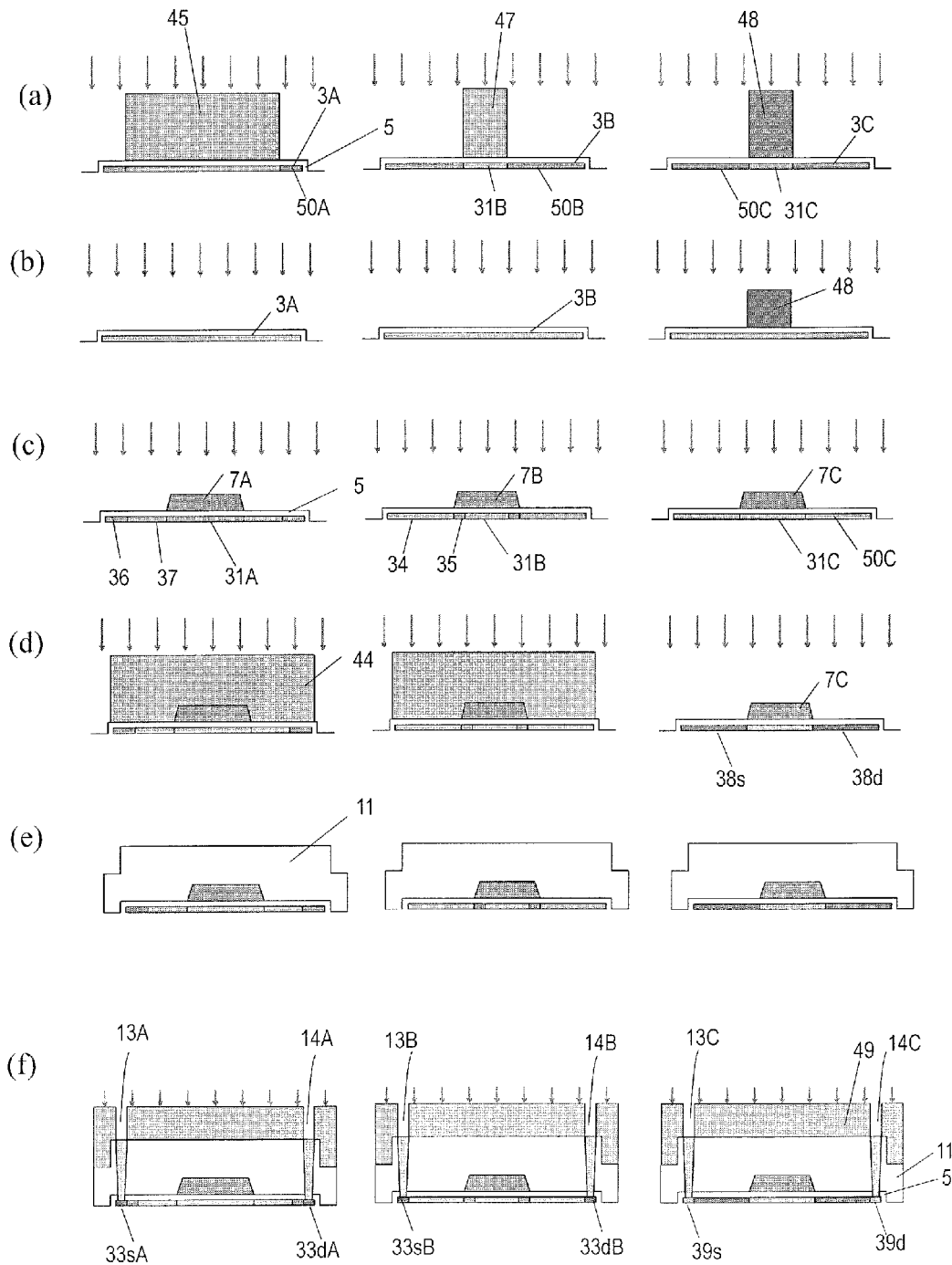
FIG. 9 (a) to (f) are schematic stepwise cross-sectional views illustrating a method for manufacturing a semiconductor device of the third embodiment.

Firstly, as shown in FIG. 9(a), an island-like semiconductor layer 3A is formed in a region of the substrate 1 in which the LDD structure TFT is to be formed, an island-like semiconductor layer 33 is formed in a region of the substrate 1 in which the GOLD structure TFT is to be formed, and an island-like semiconductor layer 3C is formed in a region of the substrate 1 in which the p-type TFT is to be formed. Then, a gate insulating layer 5 is formed so as to cover these semiconductor layers 3A, 3B, 3C. The formation method of these layers are the same as that previously described with reference to FIG. 6(a).

Then, a resist mask 45 covering part of the semiconductor layer 3A, a resist mask 47 covering part of the semiconductor layer 3B which is to be the channel region, and a resist mask 48 covering part of the semiconductor layer 3C which is to be the channel region are formed through a known photolithography process. The resist mask 45 is arranged so as to expose part of the semiconductor layer 3A in which a high-concentration impurity region is to be formed and to cover parts of the semiconductor layer 3A in which the channel region and the LDD region are to be formed. Here, a multilevel mask, such as halftone mask, is used as the resist mask 48.

Thereafter, a n-type impurity ion is implanted into the semiconductor layers 3A, 3B, 3C at a low concentration using the resist masks 45, 47, 48, whereby low concentration implanted regions 50A, 50B, 50C are obtained (first ion implantation step). Here, phosphorus ion is implanted as the impurity ion. In the ion implantation, the acceleration voltage is for example 60 kV, and the dose amount is $1 \times 10^{13}/cm^2$.

Then, as shown in FIG. 9(b), the resist masks 45, 47 are removed, and an ashing treatment (half ashing) is performed on the resist mask 48, whereby the height of the resist mask 48 is reduced. Thereafter, a p-type impurity is implanted into the semiconductor layers 3A, 3B, 3C using the height-reduced resist mask 48 as mask. The p-type impurity is implanted into a portion of the semiconductor layers 3A, 3B which is to be the channel region (channel doping). Here, for example, boron ion is implanted under the conditions that the acceleration voltage is 30 kV and the dose amount is $1 \times 10^{12}/cm^2$.

Then, as shown in FIG. 9(c), gate electrodes 7A, 7B, 7C are formed on the semiconductor layers 3A, 3B, 3C, respectively. The gate electrode 7C is placed on part of the low concentration implanted region 50C of the semiconductor layer 3C which is to be the channel region. The formation method of the gate electrodes 7A, 7B, 7C and the arrangement of the gate electrodes 7A, 7B may be the same as those of the process which has previously been described with reference to FIG. 6(b).

Then, a n-type impurity ion implanted into the semiconductor layers 3A, 3B, 3C at a low concentration using the gate electrodes 7A, 7B, 7C as the mask (second ion implantation step). The implantation conditions may be the same as the conditions for the second ion implantation step shown in FIG. 6(c). As a result, as previously described with reference to FIG. 6(c), the third and fourth LDD regions 36, 37 are formed in the semiconductor layer 3A, and the first and second LDD regions 34, 35 are formed in the semiconductor layer 3B.

Then, as shown in FIG. 9(d), a resist mask 44 is provided so as to cover the LDD structure formation region and the GOLD structure formation region and expose the p-type TFT formation region, and a p-type impurity ion is implanted at a high concentration into the uncovered portion of the gate electrode 7C of the semiconductor layer 3C across the gate insulating layer 5. Thereby, a source region 38s and a drain region 38d are formed in the semiconductor layer 3C. For example, boron ion is implanted under the conditions that the acceleration voltage is not less than 50 kV and not more than 90 kV and the dose amount is not less than $5 \times 10^{14}/cm^2$ and not more than $5 \times 10^{15}/cm^2$, although the implantation conditions are not particularly limited.

After the resist mask 44 is removed, activation annealing (first activation annealing) is performed. Thereby, the ion implanted in the semiconductor layers 3A, 3B, 3C by the first ion implantation step, the channel doping and the p-type impurity doping is activated, and the crystallinity of the semiconductor layers 3A, 3B, 3C is restored. The annealing temperature is not particularly limited but may be, for example, not less than 500° C. and not more than 700° C.

Then, as shown in FIG. 9(e), an interlayer insulating layer 11 is formed so as to cover the semiconductor layers 3A, 3B, 3C, the gate electrodes 7A, 7B, 7C and the gate insulating layer 5. Thereafter, when necessary, hydrogenation may be performed. The formation method and the hydrogenation annealing method for the interlayer insulating layer 11 may be the same as those previously described with reference to FIG. 3(d).

Then, as shown in FIG. 9(f), a resist mask 49 which has an opening is formed on the interlayer insulating layer 11, and the interlayer insulating layer 11 is patterned using the resist mask 49. Thereby, a source contact hole 13A and a drain contact hole 14A extending to part of the third LDD region 36 of the semiconductor layer 3A, a source contact hole 13B and a drain contact hole 14B extending to part of the first LDD region 34 of the semiconductor layer 3B, source contact hole 13C and a drain contact hole 14C extending to the source region 38s and the drain region 38d, respectively, of the semiconductor layer 3C are formed in the interlayer insulating layer 11.

Then, via these contact holes 13A, 13B, 13C, 14A, 14B, 14C, impurity ion is implanted into the semiconductor layers 3A, 3B, 3C (contact doping step). The ion implantation conditions may be the same as the conditions for the contact doping step shown in FIG. 3(e). Thereby, source regions 33sA, 33sB and drain regions 33dA, 33dB are formed in the semiconductor layers 3A, 3B. In this step, the n-type impurity ion is also implanted into the semiconductor layer 3C that is to be the p-type TFT, whereby a source contact region 39s and a drain contact region 39d are obtained. Thereafter, the resist mask 49 is removed. Note that, in this contact doping step, a n-type impurity is implanted at a low dose into the source and drain regions 38s, 38d in which the p-type impurity has been implanted at a high concentration in the step shown in FIG. 9(d). Thus, the regions in which the n-type impurity is implanted (source contact region 39s, drain contact region 39d) would not change into n-type regions. Note that the contact doping may be performed after the resist mask 49 is removed.

Thereafter, the second activation annealing is performed, whereby the crystallinity of the source/drain region of the semiconductor layers 3A, 3B and the contact regions 39s, 39d of the semiconductor layer 3C is restored, and the implanted ion is activated. Then, although not shown, a source electrode and a drain electrode are formed in respective TFTs. In this way, semiconductor device which includes the TFTs 102, 202, 302 is manufactured. The second activation annealing may be performed at a temperature lower than that of the above-described first activation annealing, for example, may be performed at a temperature lower than 300° C.

In the above-described method, contact doping is utilized to form the high concentration implanted regions of the TFTs 102, 202. And, the halftone mask is utilized to perform channel doping. Therefore, it is not necessary to form the doping mask for formation of the high concentration implanted regions and the mask for the channel doping. Thus, the number of photomasks used can be reduced by two.

Patent Document 1 and Japanese Laid-Open Patent Publication No. 2001-85695 disclose the methods for reducing the number of photomasks with the use of halftone mask. However, in these methods, it is necessary to control the line width of the resist pattern by etching. On the other hand, in the above-described method, a halftone mask is adopted for separate implantation in doping, and therefore, it is not necessary to control the line width. Thus, the number of photomasks can be reduced without deteriorating the line width controllability.

Note that the method of the present embodiment not limited to the above-described method. The halftone mask for the channel doping may not be used. Alternatively, the channel doping may not be performed.

INDUSTRIAL APPLICABILITY

The present invention is widely applicable to an oxide semiconductor TFT and a variety of semiconductor devices which include the oxide semiconductor TFT. For example, the present invention is also applicable to circuit boards such as active matrix substrates and the like, display devices such as liquid crystal display devices, organic electroluminescence (EL) display devices, inorganic electroluminescence display devices, MEMS display devices, and the like, imaging devices such as image sensor devices and the like, and various electronic devices such as image input devices, fingerprint readers, semiconductor memories and the like.

REFERENCE SIGNS LIST 1 substrate
3A, 3B, 3C semiconductor layer
5 gate insulating layer
7A, 7B, 7C gate electrode
8A, 8B, 8C source electrode
9A, 9B, 9C drain electrode
11 interlayer insulating layer
13A, 13B, 13C source contact hole
14A, 14B, 14C drain contact hole
30A, 30B low concentration implanted region
31A, 31B, 31C channel region
32A, 32B LDD region (low-concentration impurity region)
33sA, 33sB, 38s source region (high-concentration impurity region)
33dA, 33dB, 38d drain region (high-concentration impurity region)
34 first LDD region (high concentration LDD region)
35 second LDD region (low concentration LDD region, NM region)
36 third LDD region (high concentration LDD region)
37 fourth LDD region (low concentration LDD region)
39s source contact region
39d drain contact region
41, 42, 44, 45, 47, 49 resist mask
50A, 50B, 50C low concentration implanted region
200, 201, 202 GOLD structure TFT
100, 101, 102 LDD structure TFT

The invention claimed is:

1. A semiconductor device comprising at least one thin film transistor on a substrate, the at least one thin film transistor including
a semiconductor layer which includes a channel region, a high-concentration impurity region containing a first conductivity type impurity, and a low-concentration impurity region which is located between the channel region and the high-concentration impurity region, the low-concentration impurity region containing the first conductivity type impurity at a concentration lower than in the high-concentration impurity region and higher than in the channel region,
a gate insulating layer provided on the semiconductor layer,
a gate electrode provided on the gate insulating layer and arranged so as to extend over at least the channel region,
an interlayer insulating layer provided on the gate electrode and the gate insulating layer, and
a source electrode and a drain electrode which are coupled with the semiconductor layer,
wherein the interlayer insulating layer and the gate insulating layer have a contact hole extending to the semiconductor layer, at least one of the source electrode and the drain electrode being provided on the interlayer insulating layer and in the contact hole and being in contact with the high-concentration impurity region inside the contact hole,
at a side wall of the contact hole, a side surface of the gate insulating layer is aligned with a side surface of the interlayer insulating layer,
at an upper surface of the semiconductor layer, an edge of the contact hole is aligned with an edge of the high-concentration impurity region,
the at least one thin film transistor includes a first thin film transistor,
in the first thin film transistor, the low-concentration impurity region includes a first low-concentration impurity region which is in contact with the high-concentration impurity region and a second low-concentration impurity region which is closer to the channel region than the first low-concentration impurity region,
the first low-concentration impurity region contains the first conductivity type impurity at a concentration higher than in the second low-concentration impurity region,
the entire low-concentration impurity region in the first thin film transistor does not overlap the gate electrode when viewed in a direction normal to the substrate, and
in the first thin film transistor, an edge of the low-concentration impurity region which is on the channel region side is located in a same location as a part of an edge of the gate electrode in a direction perpendicular to the normal direction, when viewed in the normal direction.

2. The semiconductor device of claim 1, wherein the high-concentration impurity region is located inside the low-concentration impurity region when viewed in a direction normal to the substrate.

3. The semiconductor device of claim 1, wherein
the at least one thin film transistor includes a second thin film transistor,
in the second thin film transistor, a part of the low-concentration impurity region is covered with the gate electrode with the gate insulating layer interposed therebetween,
in the second thin film transistor, the low-concentration impurity region includes a third low-concentration impurity region which is in contact with the high-concentration impurity region and a fourth low-concentration impurity region which is closer to the channel region than the third low-concentration impurity region,
the third low-concentration impurity region contains the first conductivity type impurity at a concentration higher than in the fourth low-concentration impurity region and does not overlap the gate electrode when viewed in the normal direction, and
the fourth low-concentration impurity region overlaps the gate electrode when viewed in the normal direction.

4. The semiconductor device of claim 3, wherein the first low-concentration impurity region of the first thin film transistor and the third low-concentration impurity region of the second thin film transistor contain a same impurity element, and the first and third low-concentration impurity regions have substantially equal concentration profiles of the first conductivity type impurity in a thickness direction.

5. The semiconductor device of claim 1, further comprising another thin film transistor which has a different conductivity type from that of the at least one thin film transistor, wherein the another thin film transistor includes another semiconductor layer including a channel region, a contact region, and another high-concentration impurity region which is located between the channel region and the contact region and which contains a second conductivity type impurity, the contact region containing the second conductivity type impurity at a same concentration as the another high concentration impurity region and containing the first conductivity type impurity at a concentration higher than the another high concentration impurity region, the gate insulating layer extending over the another semiconductor layer, another gate electrode provided on the gate insulating layer, the interlayer insulating layer extending over the another gate electrode and the gate insulating layer, and another source electrode and another drain electrode which are coupled with the another semiconductor layer, the interlayer insulating layer and the gate insulating layer have another contact hole extending to the another semiconductor layer, at least one of the another source electrode and the another drain electrode being provided on the interlayer insulating layer and in the another contact hole and being in contact with the contact region inside the another contact hole, at a side wall of the another contact hole, a side surface of the gate insulating layer is aligned with a side surface of the interlayer insulating layer, and at an upper surface of the another semiconductor layer, an edge of the another contact hole is aligned with an edge of the contact region.

* * * * *